US012750019B2

(12) United States Patent
Mallinson

(10) Patent No.: US 12,750,019 B2
(45) Date of Patent: Sep. 29, 2026

(54) COMBINED CLASS D AMPLIFIER AND BUCK REGULATOR

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 169 days.

(21) Appl. No.: 18/751,180

(22) Filed: Jun. 21, 2024

(65) Prior Publication Data

US 2024/0348213 A1 Oct. 17, 2024

Related U.S. Application Data

(63) Continuation-in-part of application No. 17/838,204, filed on Jun. 11, 2022, now Pat. No. 12,021,491.

(60) Provisional application No. 63/210,047, filed on Jun. 13, 2021.

(51) Int. Cl.
*H03F 3/217* (2006.01)
*H03F 1/02* (2006.01)

(52) U.S. Cl.
CPC ......... *H03F 3/2171* (2013.01); *H03F 1/0205* (2013.01); *H03F 2200/03* (2013.01); *H03F 2200/331* (2013.01); *H03F 2200/78* (2013.01)

(58) Field of Classification Search
CPC ..................................................... H03F 3/2173
USPC .................................................... 330/146, 72
See application file for complete search history.

(56) References Cited

U.S. PATENT DOCUMENTS

| | | | | |
|---|---|---|---|---|
| 2,758,160 | A * | 8/1956 | Baskin | H03F 3/44 330/72 |
| 5,003,271 | A * | 3/1991 | Swanson | H03F 3/2175 330/207 P |
| 7,307,474 | B2 * | 12/2007 | Nguyen | H03F 3/217 330/146 |
| 11,381,239 | B1 * | 7/2022 | Lesso | H02N 2/0075 |
| 11,658,623 | B2 * | 5/2023 | Lesso | H04R 3/00 330/251 |
| 2025/0373156 | A1 * | 12/2025 | Lim | H02M 3/155 |

* cited by examiner

*Primary Examiner* — Henry Choe
(74) *Attorney, Agent, or Firm* — Ahmann Kloke LLP

(57) ABSTRACT

An apparatus and method for improving the efficiency of a D class amplifier, particularly at lower output levels. A class D amplifier having a load with inductance, such as a transducer, is configured to concurrently act as its own buck regulator. A capacitor connected to ground and to both ends of the transducer through switches functions as the buck regulator in connection with the inductance of the transducer, providing the class D amplifier with additional voltage levels such as might be provided by a G/H class amplifier but without the added complexity or expense of the G/H configurations. Better efficiency is possible than that provided by a 100% efficient conventional buck regulator. No envelope detector is required, nor any change to the gain of the digital signal to the class D amplifier. Both synchronous and asynchronous applications are possible. Feedback may be used if desired, but is not required.

19 Claims, 10 Drawing Sheets

300

300

| | Next | M1 | M2 | M3 | M4 | M5 | M6 | M7 | M8 |
|---|---|---|---|---|---|---|---|---|---|
| 1 | 2,3 | L | H | M | H | L | M | L | H |
| 2 | 1,4,5,6 | L | H | L | H | L | M | H | L |
| 3 | 1,4,5,6 | H | L | M | H | L | H | L | H |
| 4 | 2,3,7,8 | H | M | M | H | H | L | L | H |
| 5 | 2,3,7,8 | H | L | L | H | L | H | H | L |
| 6 | 2,3,7,8 | L | H | H | L | L | M | M | L |
| 7 | 4,5,6,9 | H | L | H | L | L | H | M | L |
| 8 | 4,5,6,9 | H | M | L | H | H | L | H | L |
| 9 | 7,8 | H | M | H | L | H | L | M | L |

700

Fig. 7

| | M1 | M2 | M3 | M4 | M5 | M6 | M7 | M8 | Trans |
|---|---|---|---|---|---|---|---|---|---|
| 1=>2 | L | H | M=>L | H | L | M | L=>H | H=>L | 2.5 |
| 1=>3 | L=>H | H=>L | M | H | L | M=>H | L | H | 2.5 |
| 2=>1 | L | H | L=>M | H | L | M | H=>L | L=>H | 2.5 |
| 2=>4 | L=>H | H=>M | L=>M | H | L=>H | M=>L | H=>L | L=>H | 5.5 |
| 2=>5 | L=>H | H=>L | L | H | L | M=>H | H | L | 2.5 |
| 2=>6 | L | H | L=>H | H=>L | L | M | H=>M | L | 2.5 |
| 3=>1 | H=>L | L=>H | M | H | L | H=>M | L | H | 2.5 |
| 3=>4 | H | L=>M | M | H | L=>H | H=>L | L | H | 2.5 |
| 3=>5 | H | L | M=>L | H | L | H | L=>H | H=>L | 2.5 |
| 3=>6 | H=>L | L=>H | M=>H | H=>L | L | H=>M | L=>M | H=>L | 5.5 |
| 4=>2 | H=>L | M=>H | M=>L | H | H=>L | L=>M | L=>H | H=>L | 5.5 |
| 4=>3 | H | M=>L | M | H | H=>L | L=>H | L | H | 2.5 |
| 4=>7 | H | M=>L | M=>H | H=>L | H=>L | L=>H | L=>M | H=>L | 5.5 |
| 4=>8 | H | M | M=>L | H | H | L | L=>H | H=>L | 2.5 |
| 5=>2 | H=>L | L=>H | L | H | L | H=>M | H | L | 2.5 |
| 5=>3 | H | L | L=>M | H | H | H | H=>L | L=>H | 2.5 |
| 5=>7 | H | L | L=>H | H=>L | L | H | H=>M | L | 2.5 |
| 5=>8 | H | L=>M | L | H | L=>H | H=>L | H | L | 2.5 |
| 6=>2 | L | H | H=>L | L=>H | L | M | M=>H | L | 2.5 |
| 6=>3 | L=>H | H=>L | H=>M | L=>H | L | M=>H | M=>L | L=>H | 5.5 |
| 6=>7 | L=>H | H=>L | H | L | L | M=>H | M | L | 2.5 |
| 6=>8 | L=>H | H=>M | L=>H | L=>H | L=>H | M=>L | M=>H | L | 5.5 |
| 7=>4 | H | L=>M | H=>M | L=>H | L=>H | H=>L | M=>L | L=>H | 5.5 |
| 7=>5 | H | L | M=>L | L=>H | L | H | M=>H | L | 2.5 |
| 7=>6 | H=>L | L=>H | H | L | L | H=>M | M | L | 2.5 |
| 7=>9 | H | L=>M | H | L | L=>H | H=>L | M | L | 2.5 |
| 8=>4 | H | M | L=>M | H | H | L | H=>L | L=>H | 2.5 |
| 8=>5 | H | M=>L | L | H | H=>L | L=>H | H | L | 2.5 |
| 8=>6 | H=>L | M=>H | H=>L | H=>L | H=>L | L=>M | H=>M | L | 5.5 |
| 8=>9 | H | M | L=>H | H=>L | H | L | H=>M | L | 2.5 |
| 9=>7 | H | M=>L | H | L | H=>L | L=>H | M | L | 2.5 |
| 9=>8 | H | M | H=>L | L=>H | H | L | M=>H | L | 2.5 |

800

Fig. 8

COMBINED CLASS D AMPLIFIER AND BUCK REGULATOR

CROSS-REFERENCE TO RELATED APPLICATIONS

This application is a continuation-in-part of U.S. application Ser. No. 17/838,204, filed Jun. 11, 2022, entitled "COMBINED CLASS D AMPLIFIER AND BUCK REGULATOR." which claims the benefit of and priority from U.S. Provisional Application No. 63/210,047, filed Jun. 13, 2021, entitled "A COMBINED CLASS-D AND BUCK REGULATOR," which are incorporated by reference herein in their entirety.

FIELD OF THE INVENTION

The present invention relates generally to amplifiers, and more particularly to improving the efficiency of class D amplifiers.

BACKGROUND OF THE INVENTION

As is well known in the art, power amplifier circuits (output stages) are classified in two major groups. One group contains linear designs, classes A, B, AB and C, while the other group contains switching designs, classes D, E, F, G, H and more. The classes are based on the proportion of each input cycle (called conduction angle) during which an amplifying device passes current.

In linear designs the output stage transistor creates a continuous representation of the input signal; its operation lies somewhere between being "fully-on" and "fully-off," with resulting tradeoffs in linearity versus efficiency. By contrast, switching designs do not create a continuous representation of the input signal, but rather remains fixed at certain well defined and discrete levels, using discrete switching to generate the output waveform. Switching designs thus operate with a much higher efficiency, in theory even approaching 100 percent.

A class D amplifier is one type of switching amplifier; as with other switching amplifiers, the output is not a continuous signal occupying arbitrary levels but rather constantly switches the signal between "fully-on" and "fully-off," so that the output signal consists of discrete, possibly time-varying output levels which are visited in a sequence such that the average output value represents the signal. Other classes of switching amplifiers, such as class G and H and similar amplifiers also use PWM.

A class D amplifier is desirable because it has higher efficiency and thus reduces wasted power. The higher efficiency is achieved because the switches driving the bridge are either on and dropping little voltage, or off and taking no current. Since the power dissipated is the product of voltage and current, the switch dissipates very little power and in some cases virtually all the power is thus delivered to the load. Battery life in applications using class D or similar switching amplifiers is therefore significantly improved and there is considerable commercial demand for such devices.

However, in practice the efficiency of a class D amplifier cannot be 100% because the act of turning on and off the switches, which are typically large field effect transistor (FET) devices, itself dissipates power. The efficiency of the amplifier is higher at higher output power levels, as the power dissipated by the FETs, which is constant, is a smaller portion of the higher output power.

Thus, while D class amplifiers are very efficient at higher output power levels, it is desirable to improve efficiency at more typical, lower, output power levels.

SUMMARY OF THE INVENTION

Described herein is an apparatus and method for improving the efficiency of a D class amplifier, particularly at lower output levels.

One embodiment discloses a circuit for amplifying a digital signal, the digital signal having been derived from an input signal having a signal envelope, comprising: a transducer configured to output a signal based upon a voltage signal applied to the transducer, having two ends and an inductance; a plurality of switches each having a first end and a second end and two states, a first state configured to allow current to flow and a second state configured to prevent current from flowing; a first switch having its first end connected to a supply voltage and its second end connected to a first end of the load element; a second switch having its first end connected to a ground and its second end connected to the first end of the load element; a third switch having its first end connected to a supply voltage and its second end connected to a second end of the load element; a fourth switch having its first end connected to the ground and its second end connected to the second end of the load element; a fifth switch having its first end connected to the first end of the load; a sixth switch having its first end connected to the second end of the load; a capacitor having a first end and a second end, the first end of the capacitor connected to the second end of the fifth switch and the second end of the sixth switch, and the second end of the capacitor connected to a fixed voltage; and a control circuit configured to control the states of the six switches to provide the transducer with a sequence of voltage pulses based upon the input signal, each voltage pulse being at one of a plurality of discrete values defined by the states of the switches, the average value of the voltage pulses over time following the analog signal envelope and supplying the transducer with a voltage that causes the transducer to output an amplified signal.

Another embodiment discloses a method of amplifying a signal with a modified class D amplifier having a load with inductance, the class D amplifier connected to a single supply voltage by a plurality of switches, comprising: causing, by a processor, the switches to open and close to create a sequence of states that supply voltage to the transducer to cause the transducer to produce an amplified signal, wherein the states include: a first state that supplies voltage to the transducer at the supply voltage; second and third states that supply voltage to the transducer at half the supply voltage; fourth and fifth states that supply no voltage to the transducer; sixth and seventh states that supply voltage to the transducer at a voltage that is a negative one half of the supply voltage; an eighth state that supplies voltage to the transducer at a voltage that is the negative of the supply voltage; and wherein the sequence of states is limited such that transitions from one state to another may only occur from: the first state to the second or third state; the second state to the first, fourth or fifth state; the third state to the first, fourth or fifth state; the fourth state to the second, third, sixth or seventh state; the fifth state to the second, third, sixth or seventh state; the sixth state to the fourth, fifth or eighth state; the seventh state to the fourth, fifth or eighth state; and the eighth state to the sixth or seventh state.

Yet another embodiment discloses a circuit for amplifying a digital signal, the digital signal having been derived from an input signal having a signal envelope, comprising: a transducer configured to output a signal based upon a voltage signal applied to the transducer, and having a first end and a second end and an inductance; a first transistor having a gate, a source and a drain, the source connected to a voltage supply; a second transistor having a gate, a source and a drain, the drain connected to the drain of the first transistor and the first end of the transducer; a third transistor having a gate, a source and a drain, the drain connected to the second end of the transducer; a fourth transistor having a gate, a source and a drain, the source connected to the voltage supply and the drain connected to the drain of the third transistor and the second end of the transducer; a fifth transistor having a gate, a source and a drain, the drain connected to the drain of the first transistor, the drain of the second transistor and the first end of the transducer, and the source connected to a ground; a sixth transistor having a gate, a source and a drain, the drain connected to the drain of the first transistor, the drain of the second transistor, the drain of the fifth transistor and the first end of the transducer, a seventh transistor having a gate, a source and a drain, the drain connected to the drain of the third transistor, the drain of the fourth transistor and the second end of the transducer, an eighth transistor having a gate, a source and a drain, the drain connected to the drain of the third transistor, the drain of the fourth transistor, the drain of the seventh transistor and the second end of the transducer, and the source connected to a ground; a capacitor having a first end and a second end, the first end connected to the source of the second transistor, the source of the third transistor, the source of the sixth transistor and the source of the seventh transistor, and the second end connected to the ground; and a control circuit connected to the gates of each of the eight transistors and configured to turn the transistors on and off to provide the transducer with a sequence of voltage pulses based upon an input signal, each voltage pulse being at one of a plurality of discrete values defined by the states of the switches, the average value of the voltage pulses over time following the analog signal envelope and supplying the transducer with a voltage that causes the transducer to output an amplified signal.

Still another embodiment discloses a circuit for amplifying a digital signal, the digital signal having been derived from an input signal having a signal envelope, comprising: a transducer configured to output a signal based upon a voltage signal applied to the transducer, having two ends and an inductance; a plurality of switches each having a first end and a second end and two states, a first state configured to allow current to flow and a second state configured to prevent current from flowing; a first switch having its first end connected to a supply voltage and its second end connected to a first end of the load element; a second switch having its first end connected to a ground and its second end connected to the first end of the load element; a third switch having its first end connected to a supply voltage and its second end connected to a second end of the load element; a fourth switch having its first end connected to the ground and its second end connected to the second end of the load element; a fifth switch having its first end connected to the first end of the load; a sixth switch having its first end connected to the second end of the load; a capacitor having a first end and a second end, the first end of the capacitor connected to the second end of the fifth switch and the second end of the sixth switch, and the second end of the capacitor connected to a fixed voltage; and a control circuit configured to control the states of the six switches to provide the transducer with a sequence of voltage pulses based upon the input signal, each voltage pulse being at one of a plurality of discrete values defined by the states of the switches, the average value of the voltage pulses over time following the analog signal envelope and supplying the transducer with a voltage that causes the transducer to output an amplified signal; wherein the control circuit configured to control the states of the six switches comprises a finite state machine configured to, based upon the digital signal and a charge on the capacitor and upon receipt of a sequence of control signals, select the sequence of states of the six switches that will provide the transducer with the sequence of voltage pulses, each voltage pulse corresponding to a value of the digital signal when each control signal is received and charge or discharge the capacitor.

Yet another embodiment discloses a circuit for amplifying a digital signal, the digital signal having been derived from an input signal having a signal envelope, comprising: a transducer configured to output a signal based upon a voltage signal applied to the transducer, and having a first end and a second end and an inductance; a first transistor having a gate, a source and a drain, the source connected to a voltage supply; a second transistor having a gate, a source and a drain, the drain connected to the drain of the first transistor and the first end of the transducer; a third transistor having a gate, a source and a drain, the drain connected to the second end of the transducer; a fourth transistor having a gate, a source and a drain, the source connected to the voltage supply and the drain connected to the drain of the third transistor and the second end of the transducer; a fifth transistor having a gate, a source and a drain, the drain connected to the drain of the first transistor, the drain of the second transistor and the first end of the transducer, and the source connected to a ground; a sixth transistor having a gate, a source and a drain, the drain connected to the drain of the first transistor, the drain of the second transistor, the drain of the fifth transistor and the first end of the transducer, a seventh transistor having a gate, a source and a drain, the drain connected to the drain of the third transistor, the drain of the fourth transistor and the second end of the transducer, an eighth transistor having a gate, a source and a drain, the drain connected to the drain of the third transistor, the drain of the fourth transistor, the drain of the seventh transistor and the second end of the transducer, and the source connected to a ground; a capacitor having a first end and a second end, the first end connected to the source of the second transistor, the source of the third transistor, the source of the sixth transistor and the source of the seventh transistor, and the second end connected to the ground; and a control circuit connected to the gates of each of the eight transistors and configured to turn the transistors on and off to provide the transducer with a sequence of voltage pulses based upon an input signal, each voltage pulse being at one of a plurality of discrete values defined by the states of the switches, the average value of the voltage pulses over time following the analog signal envelope and supplying the transducer with a voltage that causes the transducer to output an amplified signal; wherein the control circuit configured to turn the transistors on and off comprises a finite state machine configured to, based upon the digital signal and a charge on the capacitor and upon receipt of a sequence of control signals, turn the transistors on and off to provide the transducer with the sequence of voltage pulses, each voltage pulse corresponding to a value of the digital signal when each control signal is received and charge or discharge the capacitor.

BRIEF DESCRIPTION OF THE DRAWINGS

FIG. 7 is a table of the gate voltages of the transistors of the circuit of FIG. 6 for each of the possible state transitions according to one embodiment of the present approach.

FIG. 8 is a table of the gate switching loss of the transistors of the circuit of FIG. 6 for each of the possible state transitions according to one embodiment of the present approach.

DETAILED DESCRIPTION OF THE INVENTION

Figure 1:
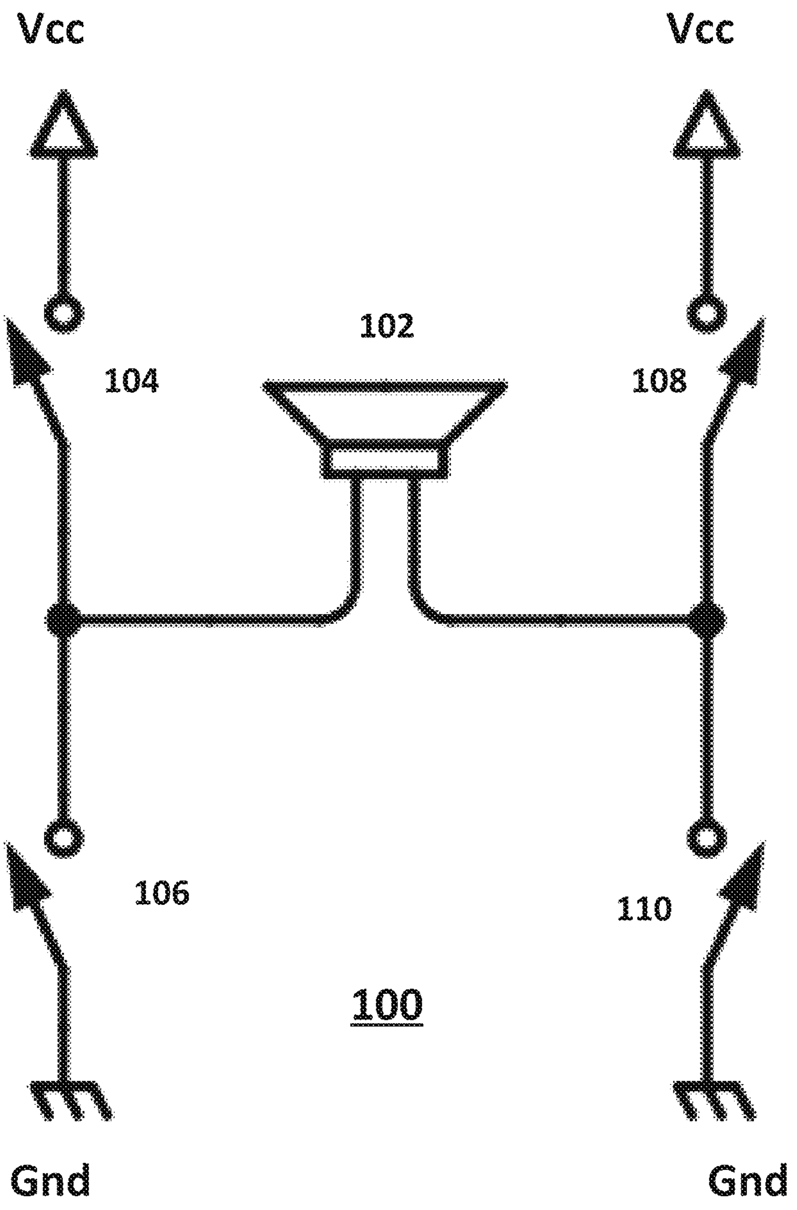
Fig. 1 (Prior art)
FIG. 1 is a diagram of a circuit comprising a typical transducer connected in a class D amplifier circuit of four switches as is known in the prior art.

Described herein is an apparatus and method for improving the efficiency of a D class amplifier, particularly at lower output levels.

The present approach seeks to improve upon the use of a class G/H regulator augmenting a class D amplifier having a load with inductance, such as a transducer, by configuring the class D amplifier itself to concurrently act as its own buck regulator. This is done by utilizing a capacitor connected to ground and to both ends of the transducer through switches; in operation, the capacitor and the inductive character of the transducer function as a buck regulator, providing the class D amplifier with additional voltage levels such as might be provided by a G/H class amplifier but without the added complexity or expense of the G/H configurations.

The present approach achieves better efficiency than even a 100% efficient conventional buck regulator would provide. No envelope detector is required, and there is no need to change the gain of the digital signal to the class D amplifier. Feedback may be used if desired, but is not required to obtain a high quality output signal.

As above, a switching driver, such as a class D amplifier or a derivative of the same, is characterized as using discrete switching in the output waveform. The driving device does not create a continuous representation of the signal, but rather it remains fixed at certain well-defined and discrete levels. While there may be as few as two, more typically there are three levels, each level enabled for variable time intervals such that the average value of the discrete signal is the desired output signal. A low-pass filter accepting the discrete levels at the variable times performs such an averaging operation and its output is sent to the transducer.

As is known in the art, the use of a third level results in quantizing an audio signal into three levels rather than two and allows for less error in the averaging of the available voltage levels; this reduces noise due to the quantization of an analog signal. As is also known, as long as the zero voltage level is driven for a period far shorter than the time constant of the inductive load, it will only have a transient effect on the load and not a steady state impact, and thus will not drain energy from the inductor.

As is also known in the art, the value of this known approach is significant. When a class D driver is used the switches that create the discrete output levels are either "on" i.e., "closed," or, in the alternative, "off" or "open." When a switch is "on" or "closed," a current flows through the switch but creates only a very small voltage across the switch, which is designed to have a low on-resistance (or drain-source resistance in a transistor used as a switch), and thus very little power is dissipated. When a switch is "off" or "open," no current at all flows in the switch, and thus no power is dissipated. Thus, essentially no power (or, more accurately, only a very small amount of power) is dissipated in creating the discrete drive levels.

FIG. 1 is a diagram of circuit 100 comprising a typical transducer, in this case a loudspeaker 102, connected in a class D amplifier bridge of four switches as is known in the prior art. In the simplest case, the switches are activated such that switches 104 and 110 at the top left and bottom right are closed, i.e., on, while switches 106 and 108 at the bottom left and top right are open, i.e., off. This applies a bridge voltage +Vcc across transducer 102 from left to right.

The switches then all change position, such that switches 104 and 110 are open or off, and switches 106 and 108 are closed or on. Now the voltage across the transducer is applied from right to left, resulting in a voltage of −Vcc. In this way, the voltage ±Vcc is driven across the transducer. As is known in the art, a third voltage level of zero may also be implemented by, for example, having switches 104 and 108 be open or off, while switches 106 and 110 are closed or on (or vice versa), thus "shorting" the transducer and resulting in zero voltage across the transducer. A digital signal processor (DSP) controls the switches to vary the time spent at the voltage +Vcc compared to −Vcc (and at zero in the case of three levels) so that the average voltage across the transducer is at the desired output value.

As above, the efficiency of a class D amplifier cannot be 100% because turning the switches (again, typically FETs) on and off dissipates power; each time a switch is cycled on or off, a charge is wasted equal to the voltage through which the gate (the controlling terminal) of the FET must be moved. The wasted power P dissipated by each switch in circuit 100 of FIG. 1 is given by:

where:

$$P = C * F * V^2$$

C is the capacitance (impedance) of the switches;

F is the frequency at which the switches operate; and

V is the voltage of the power supply Vcc.

The gate of a FET designed to present a very low impedance when turned on may amount to 20 picofarads (pF) or more. If the voltage of the power supply Vcc is 10 volts, a charge of C*V, or 0.2 nanocoulombs, will be consumed. A switch operating at a switching rate of 500 kilohertz (kHz) will thus represent a current flow of C*F*V, or 100 microamps (μA), which in turn results in power dissipation of C*F*$V^2$, of 1 milliwatt (mW). Since the class D amplifier of circuit 100 uses four such switches, it consumes 4 mW in the switches.

The efficiency E of an amplifier is given by:

$$\begin{aligned} E &= \text{Power delivered/power consumed} \\ &= \text{Power delivered/(power delivered + power dissipated)} \end{aligned}$$

If the class D amplifier of circuit 100 is driving 1 watt (W) into the load, then the efficiency E=(1 W/(1 W+4 mW)=(1 W/1.004 W), resulting in about a 0.4% loss of efficiency.

However, 1 W may be far larger than a typical output level used in some applications. For example, where the application is music, a transducer such as a pair of earbuds may only require 10 mW of power. In this case, the efficiency E=(10 mW/(10 mW+4 mW), or about 70%, which is a 30% loss of efficiency. Thus, rather than obtaining near 100% efficiency at high peak output power levels, it is desirable to improve efficiency at the lower, more typical, output power levels.

In such low power conditions, one way to achieve higher efficiency is to reduce the voltage provided to the amplifier bridge. Since the wasted power depends upon $V^2$ as above, cutting the bridge voltage in half reduces the wasted power by a factor of 4. Thus, in the example above, cutting the bridge voltage Vcc from 10 V to 5 V decreases the wasted power to 1 mW, and raises efficiency from about 70% to over 90%.

This relationship between the bridge supply voltage and the efficiency has led to the use of class G and class H amplifiers. A class G amplifier provides a set of discrete power supplies of various voltages that are constantly and automatically selected as needed to be sufficient to drive the signal but not much higher, while class H provides an essentially continuous power supply which again is adjusted to be slightly larger than the voltage required.

In both class G and class H amplifiers the voltage levels provided to the bridge follow the input signal so that the voltage level at any time just encompasses the envelope of the signal. To do this, as is known in the art, a means is required to predict the envelope and arrange the voltage to be at such a barely sufficient level. The class G and class H designs moderate the class D drive such that switching losses (and other losses due to the voltage across the bridge, such as the capacitance on the output node itself) are minimized.

A common arrangement is to use an inductive switching regulator (a "class G/H regulator") to generate the class G (discrete) or class H (continuous) power supply levels in a class D amplifier. (If a class G/H regulator were applied to a non-switching, class A/B amplifier, the amplifier would still dissipate power so that there would be no advantage in doing so.)

Consequently, one means in the known art to make a class G or class H amplifier is to precede a class D amplifier bridge with an inductive regulator, known as a buck or boost regulator.

Figure 2:
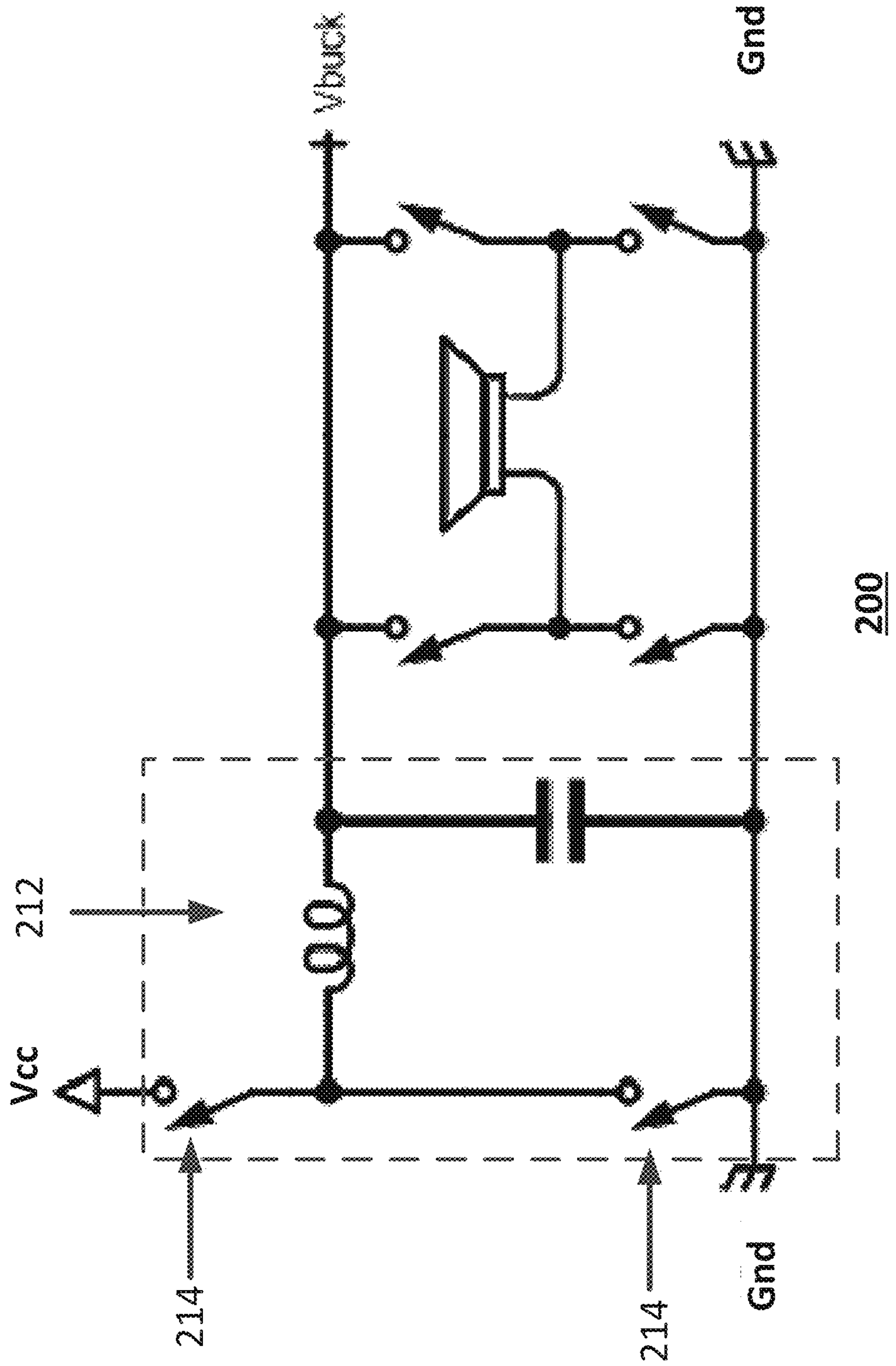
Fig. 2 (Prior art)
FIG. 2 is a diagram of a circuit comprising a typical transducer connected in a class D amplifier circuit of four switches with a buck regulator circuit as is known in the prior art.

FIG. 2 is a diagram of a circuit 200 comprising a typical transducer connected in a class D amplifier circuit of four switches with a buck regulator circuit as is known in the prior art.

Circuit 200 contains the class D amplifier circuit of FIG. 1, preceded by a buck regulator circuit 212 that contains an inductor, a capacitor and two additional switches 214. A DSP (not shown here) finds the envelope of the audio signal and controls switches 214 so that the voltage Vbuck is often less than Vcc but sufficient to encompass the peak audio signal, thus saving power in the class D amplifier portion of circuit 200.

However, the buck regulator circuit 212 has its own power dissipation, and thus is also less than 100% efficient, and the overall efficiency of circuit 200 is the efficiency of the buck regulator circuit times the efficiency of the class D amplifier circuit. In a typical case, the buck regulator circuit may achieve an efficiency of 90%; if the class D amplifier circuit also has an efficiency of 90%, then circuit 200 will have an efficiency of about 80%. This is an improvement over the class D amplifier alone which, if directly connected to the voltage Vcc, would have achieved an efficiency of about 70% in the example above. For this reason, manufacturers of mobile devices such as smartphones generally include a buck regulator circuit to improve the efficiency of the class D amplifier circuits used in such devices.

However, there are complications to the approach of FIG. 2. First, as is known in the art as above, a means is required to predict the signal envelope and adjust the voltage to encompass the expected envelope. A further complication is that the drive waveform to the class D amplifier must be changed dependent upon the output of the buck regulator, since the output to the load is the product of the voltage from the buck regulator section and the voltage generated as a fraction of that output in the class D amplifier. For this reason, all Class-G/H solutions similar to that shown in FIG. 2 require a 'gain change' in the digital data being provided to the class D amplifier.

For example, if music content requires that 1 V be driven to the load, and the buck regulator is providing 1.4 V, this will result in a 70% duty cycle digital signal (PWM signal) to the class D amplifier to provide the 1 V to the load. However, when the buck regulator responds to a prediction that the music is about to get louder, the buck regulator output may be 2 V, and the required PWM signal 50% now needs a 50% duty cycle to get 1 V delivered to the load. Thus, the PWM digital signal for any given output depends upon the voltage output from the buck regulator.

The common solution to this problem is to feed back a measurement of the output seen by the load and configure a control loop to suppress any error. However, this adds considerable complication to the overall system.

The present approach seeks to improve upon the use of a class G/H regulator augmenting the class D amplifier by configuring the class D amplifier itself to act as its own buck regulator concurrently with its operation as an amplifier.

Figure 3:
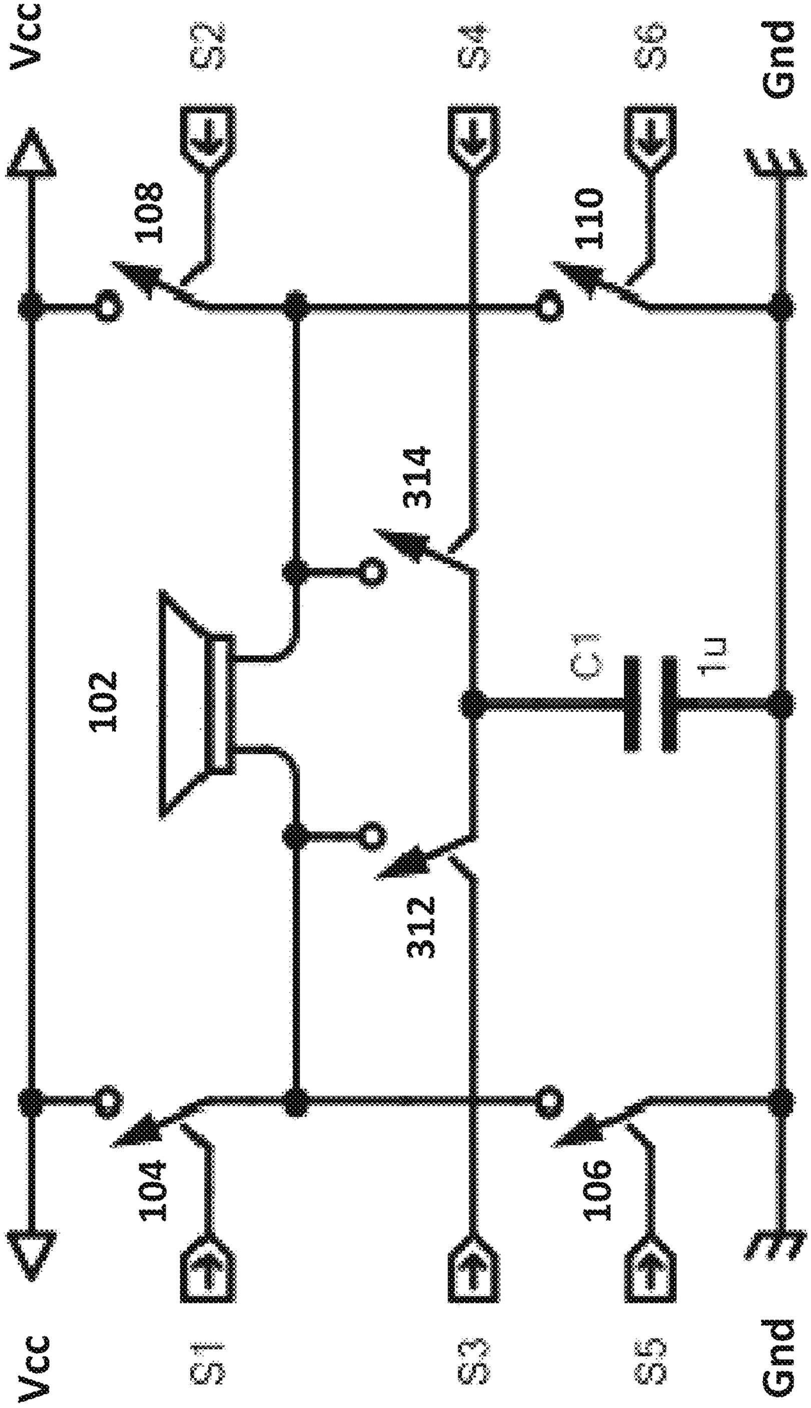
FIG. 3 is a diagram of a circuit comprising a typical transducer connected in a bridge of four switches with an additional two switches and a capacitor to add the function of a buck regulator according to one embodiment of the present approach.

FIG. 3 is a diagram of a circuit 300 comprising a typical transducer connected in a bridge of four switches with additional circuitry to provide a buck regulator function according to one embodiment of the present approach. Circuit 300 is similar to circuit 100 of FIG. 1 as it contains transducer 102 and switches 104 to 110, configured in the same way as circuit 100.

Circuit 300 adds a capacitor C1 that is connected at one end to a fixed voltage (as illustrated, a ground, but it may be any fixed voltage point, even Vcc) and at the other end to both sides of the transducer through switches 312 and 314. Switches 312 and 314 are controlled by a DSP along with switches 104 to 110 to provide transducer 102 with more voltage levels than are available in circuit 100 of FIG. 1. The inductance of the transducer 102 is used in conjunction with the capacitor C1 to fulfill the function of the buck regulator circuit 212 in circuit 200 of FIG. 2, which, as above, contains an inductor and a capacitor.

The present approach thus uses the inductive nature of the transducer 102 itself to do double duty. First, the transducer 102 continues to have the correct expected average voltage across it (the input signal), and, second, the transducer 102 is arranged to function as the inductor of a buck regulator. Because the transducer 102 is inductive it wastes very little power operating either in a class D amplifier or as a buck regulator. (One of skill in the art will appreciate that second order effects such as the series resistance of the inductor and the stray capacitance each result in some small power loss; however, to the first order, neglecting these effects, it may be said that the transducer 102 loses no power.)

There are, in effect, two control loops controlling the switches of the class D amplifier in the present approach. A first control loop is that of the signal which is ensuring that the average output across the transducer 102 is correct. A second control loop is that of the buck regulator, which is creating a fraction of the applied bridge voltage, interleaved with the music signal control such that both controllers can operate independently and concurrently.

In this configuration, the bridge has access to five distinct voltage levels, rather than three as in the case of a conventional class D amplifier as above. The five voltage levels include the plus and minus bridge voltage and zero voltage (+Vcc, 0, and −Vcc) of the conventional class D amplifier, and two additional voltage levels, a fraction of the bridge voltage (as created by the buck regulator action) and a negative fraction of the bridge voltage (again from the buck regulator action). The second control loop can be configured such that the fraction of the bridge voltage, and thus the negative fraction, is one half, so that circuit 300 can now provide ±Vcc, ±½ Vcc, and 0 volts. No specific value of the capacitor is required, as the second control loop selects between states 2 and 3 and between states 7 and 8 to achieve the target voltage.

The present approach recognizes a redundancy in the signal controller, i.e., that there are two states of certain voltages that are indistinguishable as far as the signal is concerned. For example, zero volts is created by both drive levels being at the low voltage, thus differentially providing zero volts across the transducer, and zero volts created by both drive levels being at the high voltage, also providing zero volts across the transducer. It does not matter which of these states that provide the same voltage is selected as far as a signal is concerned; however, the selection between states that are redundant as far as the signal is concerned can be made to control the buck regulator action.

Figure 4:
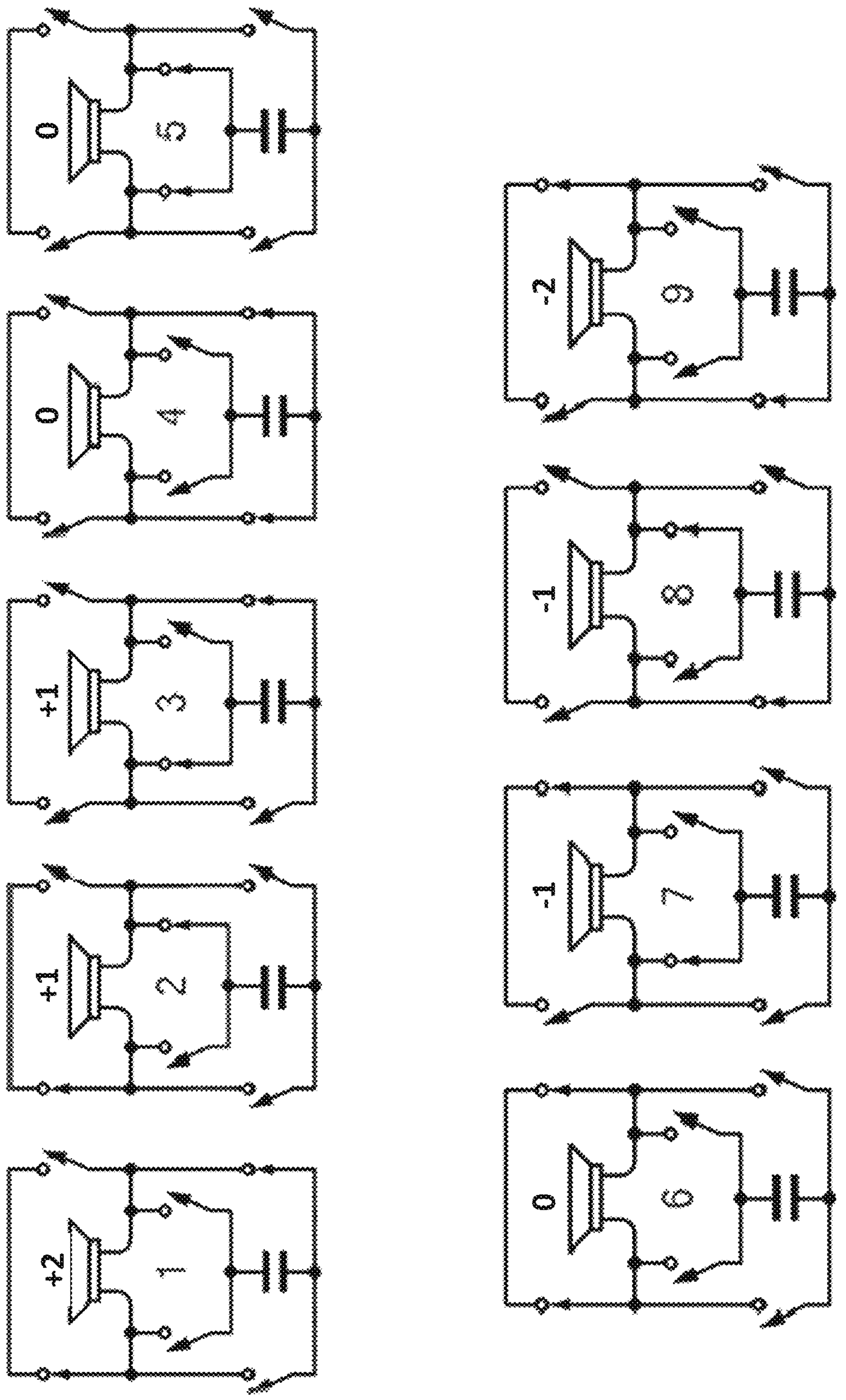
FIG. 4 is a diagram showing various configurations of the circuit of FIG. 3 according to one embodiment of the present approach.

As with the conventional class D amplifier in FIG. 1, in circuit 300 the switches may be placed in different useful configurations. FIG. 4 shows nine configurations of circuit 300, each configuration having a different combination of the switches being open or closed. Each configuration may be considered to provide a different one of nine "states," corresponding to the number in each instance of circuit 300 in FIG. 4.

For simplicity in the following discussion, above the transducer in each configuration of circuit 300 in FIG. 4 is the relative voltage across the transducer for that particular configuration. Vcc is illustrated to have a relative value of +2, so that ½ Vcc is +1; if the actual power supply Vcc is 10 V, then a "2" voltage in FIG. 4 means 10 V, and a "1" voltage means 5 V.

States (i.e., configurations) 1 and 9 in FIG. 4 provide relative voltages of +2 and −2, respectively, i.e., +Vcc and −Vcc. There are now three states, states 4, 5 and 6, which provide zero voltage, rather than the two described with respect to circuit 100 of FIG. 1. And there are now four states that produce relative voltages of ±1, i.e., ±½ Vcc, that are not available in circuit 100; states 2 and 3 provide a relative voltage of +1 and states 7 and 8 provide a relative voltage of −1.

If it is assumed that capacitor C1 is at a relative voltage of 1 (i.e., half the bridge voltage Vcc), in states 2 and 3 it may be seen that there is one state, state 2, in which the relative voltage of +1 charges capacitor C1, and another state, state 3, in which the relative voltage of +1 discharges capacitor C1. The signal control loop is not affected by which state is used, since the voltage across the transducer is the same in both cases. However, the buck regulator control loop can select between the two states to meet the condition that capacitor C1 is at a relative voltage of +1 is met.

There is similarly a pair of states, states 7 and 8 in FIG. 4, that provide a relative voltage of −1, again with state 6 charging capacitor C1 and state 7 discharging it. The buck regulator control loop can similarly select between these two states to ensure that capacitor C1 is at a relative voltage of +1.

The signal control loop does not distinguish between states 2 and 3 or states 7 and 8; it also does not distinguish between the three zero states, states 4, 5 and 6 since the voltage is 0 in each of those states. (The buck regulator control loop also does not distinguish between the three zero states, as these do not affect capacitor C1.) The signal control loop thus sees five effective states, states 1, 2/3, 4/5/6, 7/8, and 9. The buck regulator control loop can only assert control when the relative voltage is ±1, i.e., in states 2/3 and 7/8.

Figure 5:
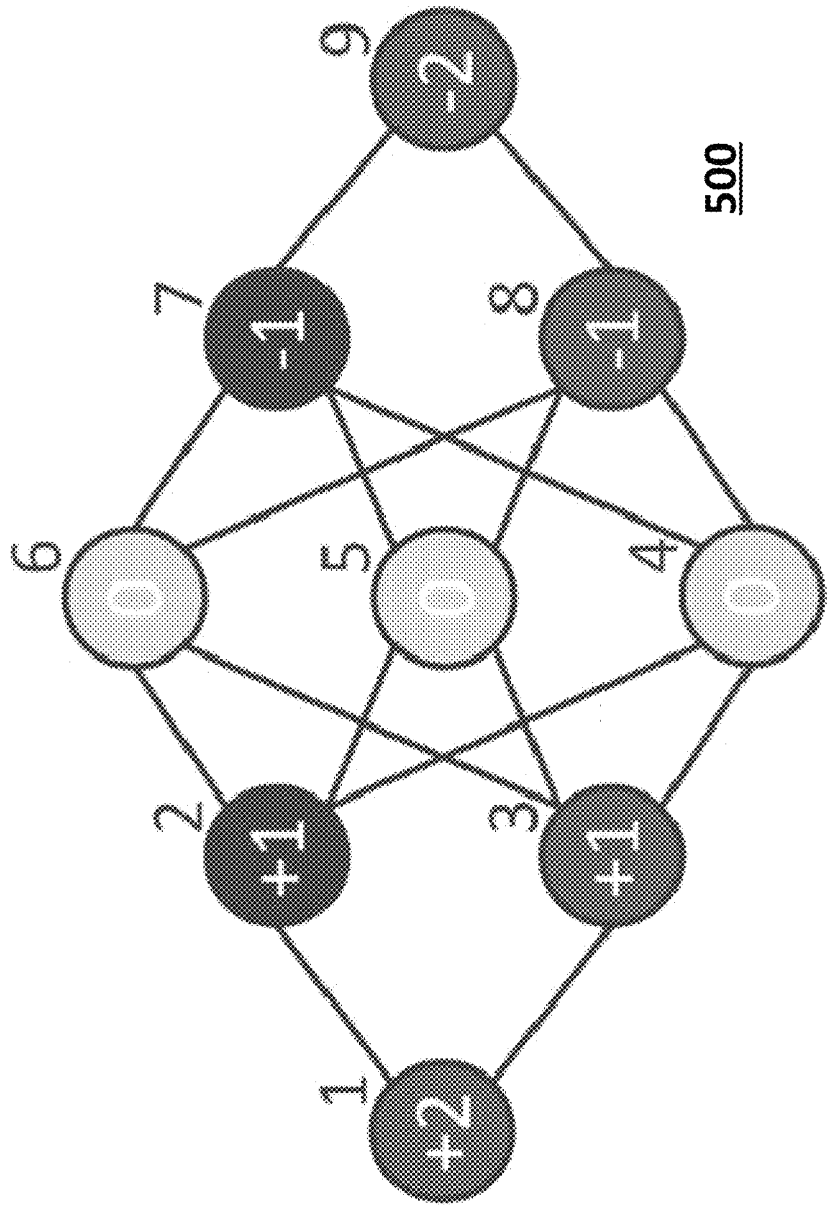
FIG. 5 is a state diagram of the state transitions that are permitted between the configurations of the circuit of FIG. 3 as shown in FIG. 4 according to one embodiment of the present approach.

FIG. 5 is a state diagram 500 of the state transitions that are permitted between the configurations of circuit 300 of FIG. 3 as shown in FIG. 4 according to one embodiment of the present approach. In state diagram 500, the circles represent nine available states corresponding to the nine circuit configurations of FIG. 4. A number outside each circle indicates which of the configurations in FIG. 4 the state corresponds to, and the number inside each circle indicates the relative voltage of that state, i.e., ±2, ±1, or 0. It may be seen that it is not possible to move from a state directly to every other state, but rather only where those states are shown as connected.

This is a not a problem, but rather normal and expected in the reproduction of an analog signal. The signal control loop will always visit the 2/3 and 7/8 states, the states in which the buck regulator control loop can assert control. When a signal, such as music, starts, the signal controller will oscillate between states 4/5/6 (i.e., 0) and states 2/3 for slightly positive signals or states 7/8 for slightly negative signals. As the music rises to a large positive signal, the signal control loop will oscillate between states 1 and states 2/3, while for large negative signals it will oscillate between states 7/8 and state 9. Thus, the buck regulator control loop is never prevented from controlling the charge on capacitor C1.

In the prior art a large signal will cause an envelope detector to boost the bridge voltage, and this boost will remain in place over some milliseconds even as the signal crosses through zero. Thus, in the prior art, zero is being output from a large bridge voltage; the bridge voltage must remain large since the envelope controller is awaiting the next cycles of the signal which are at the higher amplitude.

This decreases efficiency since the bridge voltage is unnecessarily high for that part of the cycle.

In the present approach there is no envelope tracker; the music control loop will only use the 0 and ±1 states when the signal is near zero. The present approach is thus more efficient for any given bridge voltage, as the low and high limits (i.e., visiting states 1 and 9 to obtain a voltage of ±2) are being activated at a high rate only as necessary within each cycle, thus taking advantage of the improved efficiency as a large amplitude sinusoidal signal passes through zero. The same is not true of the prior art: as above, an envelope tracker anticipating a high amplitude signal results in a large bridge voltage being present as the sinusoid passes through zero.

In one embodiment of the present approach, the buck regulator control loop is an open loop, driving equal times of charge and discharge of capacitor C1, without feedback of the actual voltage of C1. The voltage of C1 will be near the midpoint of 1, i.e., ½ Vcc, due to the equal time spend in the charge states 2 and 6 and the discharge states 3 and 7.

In this case, the zero states may be chosen so that states 4 and 6 also occur equally. This has the effect of maintaining a constant average common mode output voltage, as well as a keeping capacitor C1 at a nominally constant value at half of the bridge supply. This may be advantageous to limit common mode radiated noise.

In this simple open loop embodiment having equal charge and discharge, the voltage on capacitor C1 may not be precisely half the power supply. However, this is mitigated by the fact that the error alternates in value, so that it does not appear in the band of the signal output. Specifically, if the capacitor voltage differs from half of the supply voltage by, for example, 10 mV, the states 3 and 8 will output 10 mV more than half the power supply voltage, but states 2 and 6 will output 10 mV less than half the power supply voltage. Because the buck regulator control loop is visiting these states equally, the average error is zero.

In another embodiment, the buck regulator control loop may respond to the voltage on capacitor C1. For example, a comparison may be made between the voltage on capacitor C1 and the expected voltage of half the power supply voltage. In this closed loop embodiment, when the voltage on capacitor C1 is lower than half the supply voltage, states 2 and 7 can be preferred to charge capacitor C1, thus boosting its voltage. Similarly, when the voltage on capacitor C1 is higher than half the supply voltage, states 3 and 8 can be preferred to discharge capacitor C1, thus reducing its voltage.

Whether the buck regulator control loop is operating in open loop or closed loop fashion, the system my take some current from the capacitor node and use it to power other components, systems and devices in the application. The capacitor node then functions as a high efficiency buck regulator outputting nominally half the bridge supply (or whatever voltage the closed loop is using for comparison).

Figure 6:
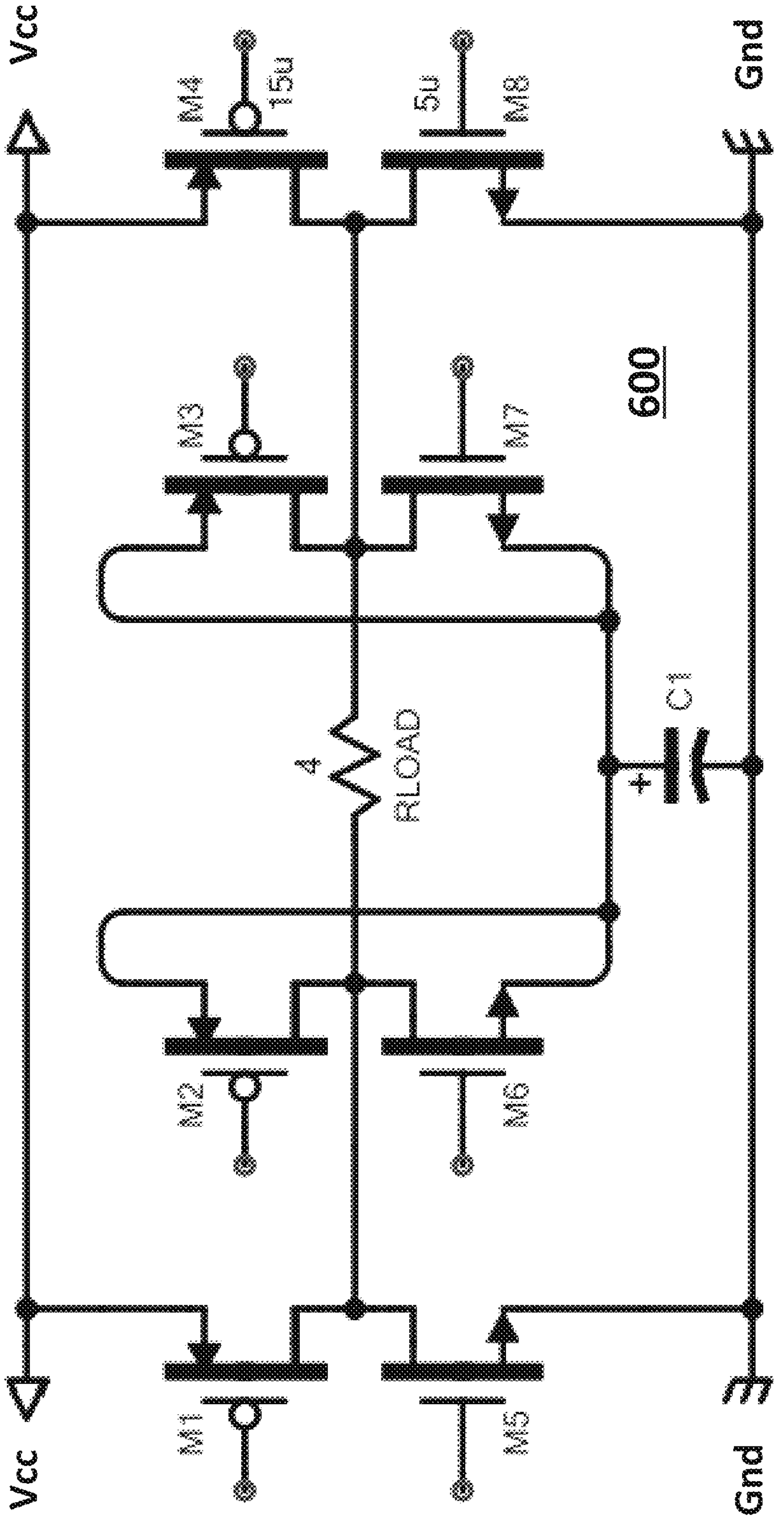
FIG. 6 is a diagram illustrating a circuit in which the circuit of FIG. 3 may be implemented with transistors according to one embodiment of the present approach.

FIG. 6 is a diagram illustrating a circuit 600 in which the circuit of FIG. 3 may be implemented with transistors according to one embodiment of the present approach.

In the embodiment of circuit 600, the switches of FIG. 3 are replaced by transistors, and may be metal oxide semiconductor field effect transistors (MOSFETs); the transducer is shown as a load RLOAD. The four transistors M1, M4, M5 and M8 correspond to switches 104, 106, 108 and 110 in circuit 300 of FIG. 3. Switches 313 and 314 in circuit 300 are replaced by transistors M2, M3, M6 and M7 in circuit 600. Transistors M1 to M4 are PNP transistors, while transistors M5 to M8 are NPN transistors.

Transistors M2, M3, M6 and M7 need not move the whole voltage supply VCC since they are nominally handling half the voltage as described above. The switches M1, M4, M5 and M8, which correspond to the switches in a conventional class D amplifier as shown in FIG. 1, do move the whole voltage Vcc.

Using the state diagram of FIG. 5, which shows the possible transitions between states, the gate voltages required for each transition may be determined.

FIG. 7 is a table of the gate voltages of the transistors of the circuit of FIG. 6 for each of the possible state transitions according to one embodiment of the present approach. Note that these are not logic states, but only the gate voltages; an H indicates that the gate voltage is the high power supply voltage Vcc, am M indicates the middle, or capacitor voltage, ½ Vcc, and a L indicates that zero voltage on the gate of the indicated transistor for the specified transition.

FIG. 8 is a table 800 of the gate switching loss for each transistor of the circuit of FIG. 6 for each of the possible state transitions according to one embodiment of the present approach. Where a horizontal line in table 800 is entirely shaded, it indicates that those gate switching transitions are costly and should be avoided if possible. Shaded entries on other lines in table 800 that are not entirely shaded indicate that the transition has the potential for one charge recovery operation. Unshaded entries in table 800 indicate a typical switching loss.

The present approach may be used in both synchronous and asynchronous applications. While, in light of the teachings herein, one of skill in the art will appreciate how this may be done, the following figures show a way in which each such type of application may be accomplished.

Figure 9:
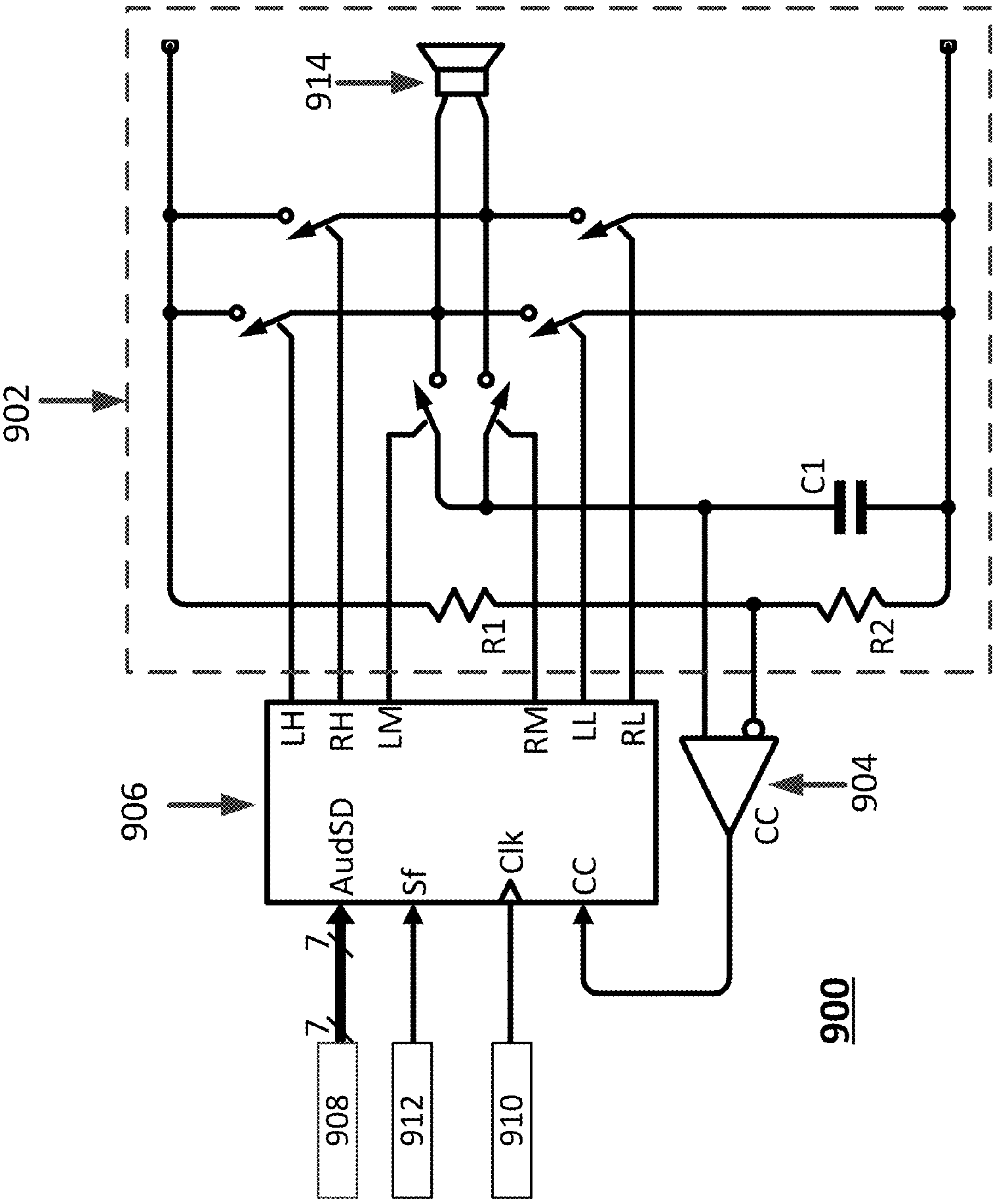
FIG. 9 is a diagram of a synchronous circuit incorporating the circuit of FIG. 3 according to one embodiment of the present approach.

FIG. 9 is a diagram of a synchronous circuit 900 incorporating the circuit of FIG. 3 according to one embodiment of the present approach.

It will be seen that the portion 902 of circuit 900 is circuit 300 of FIG. 3, with the addition of resistors R1 and R2, which, with comparator 904, produce a signal CC indicating the charge on capacitor C1.

The positions of the switches in circuit portion 902 are driven by a control circuit 906, which receives as inputs the signal CC, a digital audio signal AudSD from, for example a sigma-delta modulator or other Analog-to-Digital Circuit (“ADC”) 908, a clock signal Clk from a clock 910, and a start-frame signal Sf from a frame controller 912.

In some embodiments, control circuit 906 is a digital signal processor, while in other embodiments it may be a finite state machine that selects a state which causes the switches to assume positions corresponding to the input signal as described above. In some embodiments the clock may, for example, operate at 63 times the rate of arrival of audio samples, thus providing 63 time slots for each audio sample within which a pulse width modulation (“PWM”) pattern may be created.

In some embodiments, an optimum sequence of sequential pulse outputs after the the arrival of a new start-frame signal Sf is possible if the clock operates at an odd number times the arrival of audio samples, such as 63 as above. This is because an odd number of time slots available before the next Sf signal allows for a pattern where the smallest pulse is at the center, which creates less distortion. For example, if it is required to produce a “1” in just one time slot we can put it in the middle if the total slot count is odd. As in 7 being the ration of Clk to Sf we can create 0001000. It still works, but it is not possible to put the single impulse in the middle if the ratio is even.

Upon receipt of each clock signal Clk, control circuit 906 generates a set of signals LH, RH, LM, RM, LL, and RL. As shown, each of these signals controls a different one of the switches in circuit portion 902 and, as described above, these signals place the switches in circuit portion 902 into positions corresponding to a desired state based upon the current value of the input signal and the capacitor charge signal.

Thus, as control circuit 906 receives sequential clock signals Clk, over time control circuit 906 will cause the switches to assume a sequence of positions as described above such that the transducer 914 is provided with a sequence of voltage pulses based upon the input signal, each voltage pulse being at one of a plurality of discrete values defined by the states of the switches, with the average value of the voltage pulses over time following the analog signal envelope and supplying the transducer 914 with a voltage that causes the transducer 914 to output an amplified signal.

One of skill in the art will appreciate that there can be practical reasons not to use a synchronous circuit in some applications. For example, if the audio signals are small, making minor adjustments to them on clock edges may cause an unacceptable amount of noise. Thus, it may be desirable to use the present approach in an asynchronous circuit.

Figure 10:
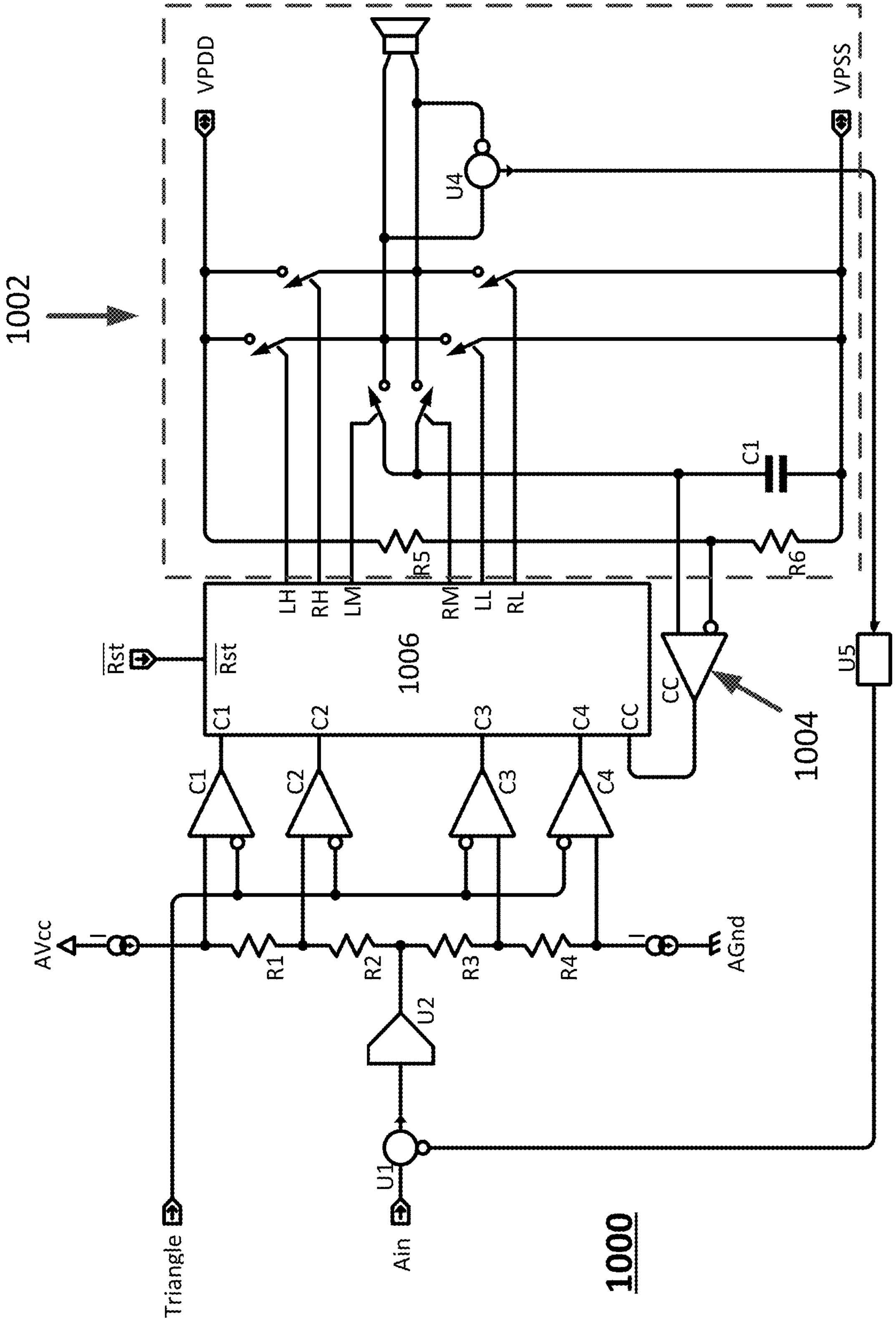
FIG. 10 is a diagram of an asynchronous circuit incorporating the circuit of FIG. 3 according to one embodiment of the present approach.

FIG. 10 is a diagram of an asynchronous circuit 1000 incorporating the circuit of FIG. 3 according to one embodiment of the present approach. Circuit 1000 has an analog loop and four comparators that compare the error in the loop output to a triangle wave; the result drives a finite state machine that causes the switches to assume a state corresponding to the input, as above.

The portion 1002 of circuit 1000 again is circuit 300 of FIG. 3, with the addition of resistors R5 and R6 and differencing element U4. As in circuit 900 of FIG. 9, resistors R5 and R6, with comparator 1004, produce a signal CC indicating the charge on capacitor C1. Differencing element U4 generates a signal that is the difference between the two voltages applied to the transducer.

A finite state machine 1006 generates a set of signals LH, RH, LM, RM, LL, and RL, as in circuit 900 above, that again place the switches in circuit portion 1002 into positions corresponding to a state that is now determined by the inputs from four comparators C1 to C4 and the capacitor charge signal.

Also, unlike circuit 900, circuit 1000 has no clock. Rather, finite state machine 1006 produces a new set of outputs at arbitrary times, based upon the transitions of the comparators, each of which relies only on the loop output value (the output of filter U2) and the current unquantized state of a triangle wave, neither of which is quantized in time; thus the comparator output transition is not quantized in time but rather is asynchronous The signal from differencing element U4 is compared to the input audio signal Ain by differencing element U1. The resulting error signal may then be optionally filtered by a filter U2 to move noise from one frequency band to another, such as a filter that might be used as a loop filter in a sigma-delta modulator. The filtered error signal is then compared to the triangle wave by four comparators C1 to C4.

In the illustrated embodiment, the thresholds of comparators C1 to C4 are set by a current I flowing in a string of four resistors R1 to R4 as shown, R2 and R3 being half the values of R1 and R4. Using R as a nominal resistor value, R1=R4=2R, R2=R3=R, so that the comparator thresholds are equally spaced and, for zero output from U2, the thresholds are symmetrically above and below that zero output. The advantage of this is that cutting off the current source (i.e., insufficient voltage across it) does not disturb the operation of the circuit, as the source or sink that is cut off is not in the active region. However, one of skill in the art will appreciate that other known methods of setting the comparator thresholds may be used.

The outputs from the comparators will be positive when the loop error from filter U2 exceeds the triangle waveform. Since the comparators receive inputs from the resistor string at different points, the outputs from the comparators will switch at different values of the loop error, thus creating a digital input to finite state machine 1006; thus, output of comparator C1 will switch when the loop error is near its lowest point, that of C2 when the loop error is moderately low, that of C3 when the loop error is moderately high, and that of C4 when the loop error is near its highest point.

Based upon the loop error from filter U2, finite state machine 1006 will cause the switches in circuit portion 1002 to assume positions corresponding to the states described above. At low loop errors, the voltage to the transducer 912 will go low, i.e., negative, while either charging or discharging the capacitor C1 as necessary as described above. As the loop error gets greater, finite state machine 1006 will cause the switches to change asynchronously as the comparator outputs change to move the voltage first toward zero and then positive in the case of large loop errors, again charging or discharging the capacitor C1 as appropriate.

The function of the signal RST-bar is to define the state at a reset or power up, during which time the outputs of the comparators may by undefined. Thus, RST-bar is asserted (low in this case) at power up/down. After the de-assertion (high in this case) of RST-bar, all transitions presented to the state machine are the asynchronous outputs of the comparators.

Note that the value of CC does not change the voltage applied to the transducer, but is instead used to determine whether to charge or discharge the capacitor C1, as described above.

In this embodiment there is an assumption that the triangle wave peak-to-peak is equal to (or perhaps slightly higher than) the string resistor current I times 2R. The comparators typically require a degree of hysteresis to prevent an arbitrarily short state (corresponding to a switch being on for a very short time).

In some embodiments, a filter U5 may filter the differential signal from differencing element U4. In the absence of filter U5, the bandwidth of the loop should be relatively low, in the range of 30-40 kHz, or noise will be unacceptably high. Filter U5 may thus be used to remove high frequencies in the differential signal and provide a higher crossover frequency.

Note that FIG. 10 is drawn as a single ended system to illustrate the assumptions in the design of the analog state machine. More typically, the implementation would be a differential one, but FIG. 10 shows the expected configuration of the comparators C1 to C4.

Appendix 1 is a code listing in Verilog for implementing the circuit 1000 of FIG. 10.

With this information and the specifications of the particular transistors used, one of skill in the art will be able to determine the sequences of switch transitions that optimize the charge consumed from the voltage supply Vcc and how the switch operations may be conducted as rapidly as possible to set the devices to the correct state. One of skill in the art will also appreciate that slowing down the bridge or reducing the size of the M1, M4, M5 and M8 transistors will reduce wasted power; reducing the size of those transistors will also slightly reduce the high-power efficiency of the circuit.

The disclosed system has been explained above with reference to several embodiments. Other embodiments will be apparent to those skilled in the art in light of this disclosure. While described in the context of a music signal, one of skill in the art will appreciate that the present approach may be advantageously be used with other analog signals in the same way that a class D amplifier, or other switching amplifiers such as class G and class H amplifiers, may be used with other analog signals. The fifth state shown in FIG. 4 (a zero voltage state) may be omitted if desired).

Certain aspects of the described method and apparatus may readily be implemented using configurations other than those described in the embodiments above, or in conjunction with elements other than or in addition to those described above. For example, as is well understood by those of skill in the art, various choices will be apparent to those of skill in the art. Further, the illustration of transistors and the associated feedback loops, resistors, etc., is exemplary; one of skill in the art will be able to select the appropriate number of transistors and related elements that is appropriate for a particular application.

These and other variations upon the embodiments are intended to be covered by the present disclosure, which is limited only by the appended claims.

APPENDIX 1

```
module BRIDGE_FSM (C1, C2, C3, C4, CC, LH, RH, LM, RM, LL, RL,
RSTB);
    // RSTB is an asynchronous active low signal. When asserted
        // the outputs are both at the capacitor voltage (i.e. zero
        // differential output)
    // C1 is the comparator output that switches when the loop
        // error (output of the U2 filter) is near its lowest
        // point,C2 switches when the loop error is moderately low,
        // C3 switches when the loop error is moderately high, and
        // C4 switches when the loop error is near its highest
        // point.
    // The comparator outputs are positive when the loop error
        // exceeds the triangle waveform.
    // LH high closes the switch in the left half bridge to VPDD
    // RH high closes the switch in the right half bridge to VPDD
    // LM high closes the switch in the left half bridge to the
        // capacitor voltage
    // RM high closes the switch in the right half bridge to the
        // capacitor voltage
    // LL high closes the switch in the left half bridge to VPSS
        // (ground)
    // RL high closes the switch in the right half bridge to VPSS
        // (ground)
    input C1, C2, C3, C4, CC, RSTB;
    output LH, RH, LM, RM, LL, RL;
    reg [5:0] S;
    // S is a concatenation of LH, RH, LM, RM, LL, RL;
    assign LH = S[5];
    assign RH = S[4];
    assign LM = S[3];
    assign RM = S[2];
    assign LL = S[1];
    assign RL = S[0];
  // The states S<n> here are the names in the state diagram of e
        // Figure 4; note that states 4 and 6 are not used.
'define S1 6'b100001
'define S2 6'b100100
'define S3 6'b001001
'define S5 6'b001100
'define S7 6'b011000
'define S8 6'b000110
'define S9 6'b010010
    // CC is not in the sensitivity list - its value is sampled
      //when any change occurs...
    always @(C1 or C2 or C3 or C4 or RSTB)
      begin
          casez ({C1,C2,C3,C4,CC,RSTB})
            6'b?????0:      S = 'S5;    // Reset - mid values
            6'b0????1:      S = 'S9;    // −2
            6'b10??01:      S = 'S7;    // −1 charging cap
            6'b10??11:      S = 'S8;    // −1 discharging cap
            6'b110??1:      S = 'S5;    // 0
            6'b111001:      S = 'S2;    // +1 charging cap
            6'b111011:      S = 'S3;    // +1 discharging cap
            6'b1111?1:      S = 'S1;    // +2
            default :       S = 6'b0;   // Should never happen!
          endcase // casez ({C1,C2,C3,C4,CC,RSTB})
      end // always @ (C1,C2,C3,C4,RSTB)
endmodule // BRIDGE_FSM
```

What is claimed is:

1. A circuit for amplifying a digital signal, the digital signal having been derived from an input signal having a signal envelope, comprising:

a transducer configured to output a signal based upon a voltage signal applied to the transducer, having two ends and an inductance;

a plurality of switches each having a first end and a second end and two states, a first state configured to allow current to flow and a second state configured to prevent current from flowing, including:

a first switch having its first end connected to a supply voltage and its second end connected to a first end of a load element;

a second switch having its first end connected to a ground and its second end connected to the first end of a load element;

a third switch having its first end connected to a supply voltage and its second end connected to a second end of the load element;

a fourth switch having its first end connected to the ground and its second end connected to the second end of the load element;

a fifth switch having its first end connected to the first end of the load element; and a sixth switch having its first end connected to the second end of the load element;

a capacitor having a first end and a second end, the first end of the capacitor connected to the second end of the fifth switch and the second end of the sixth switch, and the second end of the capacitor connected to a fixed voltage; and a control circuit configured to control the states of the six switches to provide the transducer with a sequence of voltage pulses based upon the input signal, each voltage pulse being at one of a plurality of discrete values defined by the states of the six switches, the average value of the voltage pulses over time following the signal envelope and supplying the transducer with a voltage that causes the transducer to output an amplified signal;

wherein the control circuit configured to control the states of the six switches comprises a finite state machine configured to, based upon the digital signal and a charge on the capacitor and upon receipt of a sequence of control signals, select the sequence of states of the six switches that will provide the transducer with the sequence of voltage pulses, each voltage pulse corresponding to a value of the digital signal when each control signal is received and charge or discharge the capacitor.

2. The circuit of claim 1 wherein the sequence of control signals is a sequence of clock signals.

3. The circuit of claim 1 wherein the digital signal is derived from the input signal by a sigma-delta modulator.

4. The circuit of claim 1 wherein the sequence of control signals is asynchronous.

5. The circuit of claim 1 wherein the digital signal is derived from the input signal by a circuit comprising:

a differencing element configured to subtract the voltage supplied to the transducer from the input signal to generate a loop error signal; and a plurality of comparators configured to compare the loop error signal to a triangle wave signal to determine a digital value of the loop error signal.

6. The circuit of claim 1 wherein the plurality of switches comprise transistors.

7. The circuit of claim 6 wherein the transistors are MOSFETs.

8. The circuit of claim 1 wherein the transducer is an audio transducer.

9. The circuit of claim 8 wherein the audio transducer is an earbud.

10. The circuit of claim 1 wherein the fixed voltage to which the second end of the capacitor is connected is the ground.

11. The circuit of claim 1 wherein the fixed voltage to which the second end of the capacitor is connected is the supply voltage.

12. A circuit for amplifying a digital signal, the digital signal having been derived from an input signal having a signal envelope, comprising:

a transducer configured to output a signal based upon a voltage signal applied to the transducer, and having a first end and a second end and an inductance;

a first transistor having a gate, a source and a drain, the source connected to a voltage supply;

a second transistor having a gate, a source and a drain, the drain connected to the drain of the first transistor and the first end of the transducer;

a third transistor having a gate, a source and a drain, the drain connected to the second end of the transducer;

a fourth transistor having a gate, a source and a drain, the source connected to the voltage supply and the drain connected to the drain of the third transistor and the second end of the transducer;

a fifth transistor having a gate, a source and a drain, the drain connected to the drain of the first transistor, the drain of the second transistor and the first end of the transducer, and the source connected to a ground;

a sixth transistor having a gate, a source and a drain, the drain connected to the drain of the first transistor, the drain of the second transistor, the drain of the fifth transistor and the first end of the transducer, a seventh transistor having a gate, a source and a drain, the drain connected to the drain of the third transistor, the drain of the fourth transistor and the second end of the transducer, an eighth transistor having a gate, a source and a drain, the drain connected to the drain of the third transistor, the drain of the fourth transistor, the drain of the seventh transistor and the second end of the transducer, and the source connected to a ground;

a capacitor having a first end and a second end, the first end connected to the source of the second transistor, the source of the third transistor, the source of the sixth transistor and the source of the seventh transistor, and the second end connected to the ground; and a control circuit connected to the gates of each of the eight transistors and configured to turn the transistors on and off to provide the transducer with a sequence of voltage pulses based upon an input signal, each voltage pulse being at one of a plurality of discrete values defined by the states of the transistors, the average value of the voltage pulses over time following the signal envelope and supplying the transducer with a voltage that causes the transducer to output an amplified signal;

wherein the control circuit configured to turn the transistors on and off comprises a finite state machine configured to, based upon the digital signal and a charge on the capacitor and upon receipt of a sequence of control signals, turn the transistors on and off to provide the transducer with the sequence of voltage pulses, each voltage pulse corresponding to a value of the digital signal when each control signal is received and charge or discharge the capacitor.

13. The circuit of claim 12 wherein the sequence of control signals is a sequence of clock signals.

14. The circuit of claim 12 wherein the digital signal is derived from the input signal by a sigma-delta modulator.

15. The circuit of claim 12 wherein the sequence of control signals is asynchronous.

16. The circuit of claim 12 wherein the digital signal is derived from the input signal by a circuit comprising:

a differencing element configured to subtract the voltage supplied to the transducer from the input signal to generate a loop error signal; and a plurality of comparators configured to compare the loop error signal to a triangle wave signal to determine a digital value of the loop error signal.

17. The circuit of claim 12 wherein the transistors are MOSFETs.

18. The circuit of claim 12 wherein the transducer is an audio transducer.

19. The circuit of claim 18 wherein the audio transducer is an earbud.

* * * * *